United States Patent
Shinada et al.

(10) Patent No.: US 7,870,663 B2
(45) Date of Patent: Jan. 18, 2011

(54) METHOD FOR MANUFACTURING MULTILAYER WIRING BOARD

(75) Inventors: Eiichi Shinada, Ibaraki (JP); Masahiro Katou, Ibaraki (JP); Noriaki Watanabe, Ibaraki (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 89 days.

(21) Appl. No.: 12/278,606

(22) PCT Filed: Feb. 7, 2007

(86) PCT No.: PCT/JP2007/052085
§ 371 (c)(1),
(2), (4) Date: Aug. 7, 2008

(87) PCT Pub. No.: WO2007/091582
PCT Pub. Date: Aug. 16, 2007

(65) Prior Publication Data
US 2009/0007425 A1    Jan. 8, 2009

(30) Foreign Application Priority Data
Feb. 9, 2006    (JP) .......................... 2006-032344

(51) Int. Cl.
*H05K 3/36* (2006.01)
(52) U.S. Cl. ............................. 29/830; 29/832; 29/843; 174/255; 361/785
(58) Field of Classification Search ................ 29/830, 29/832, 843; 174/255; 361/785
See application file for complete search history.

(56) References Cited

U.S. PATENT DOCUMENTS

| | | | | |
|---|---|---|---|---|
| 3,795,047 | A | * | 3/1974 | Abolafia et al. ............... 29/843 |
| 5,121,299 | A | * | 6/1992 | Frankeny et al. ............ 361/785 |
| 5,165,984 | A | | 11/1992 | Schoenthaler |
| 5,258,094 | A | | 11/1993 | Furui et al. |
| 5,509,200 | A | * | 4/1996 | Frankeny et al. ............... 29/852 |
| 5,583,321 | A | * | 12/1996 | DiStefano et al. ........... 174/264 |
| 6,098,282 | A | * | 8/2000 | Frankeny et al. ............... 29/852 |

(Continued)

FOREIGN PATENT DOCUMENTS

JP    02-178995    7/1990

(Continued)

*Primary Examiner*—C. J Arbes
(74) *Attorney, Agent, or Firm*—Antonelli, Terry, Stout & Kraus, LLP.

(57) ABSTRACT

Provided is a method for manufacturing a multilayer wiring board, by which interlayer connection is efficiently performed and a non-penetrating hole having a hollow structure or a through hole can be formed at the same time without damaging a plated portion on the inner wall of the through hole. A first printed board (1) is provided with a wiring, which has a wiring section and a bump mounting pad (14), and a substrate section. The method is provided with a step of forming a solder bump (3) on at least a bump mounting pad on the first printed board or a pad section of a second printed board (2) having the pad section (15) by using a solder paste, and a step of bonding the first printed board and the second printed board in layers by having an insulating adhesive (4) between the first printed board and the second printed board and electrically connecting the first printed board with the second printed board.

19 Claims, 6 Drawing Sheets

U.S. PATENT DOCUMENTS 6,818,477 B2 * 11/2004 Veitschegger et al. ........ 438/122
6,977,348 B2 * 12/2005 Ho et al. ..................... 174/255

FOREIGN PATENT DOCUMENTS

| JP | 04-243197 | 8/1992 |
| JP | 05-075269 | 3/1993 |
| JP | 05-090763 | 4/1993 |
| JP | 07-193096 | 7/1995 |
| JP | 10-079579 | 3/1998 |
| JP | 10-093240 | 4/1998 |
| JP | 10-200258 | 7/1998 |
| JP | 3038210 | 2/2000 |
| JP | 2002-280741 | 9/2002 |
| JP | 2003-017856 | 1/2003 |
| JP | 2003-298234 | 10/2003 |
| JP | 2005-520333 | 7/2005 |
| WO | WO 03/078153 | 9/2003 |

* cited by examiner (d)

METHOD FOR MANUFACTURING MULTILAYER WIRING BOARD

TECHNICAL FIELD

The present invention relates to a method for manufacturing multilayer wiring boards.

BACKGROUND ART

According to the prior art method for manufacturing multilayer wiring boards, generally, multiple double-sided copper-clad laminates having circuits formed thereto are alternately superposed with insulating adhesives to form an integrated multilayer structure, and through holes are provided at areas required for connection, having the inner walls of which plated. Higher wiring density is realized by minimizing the hole diameters and narrowing the wiring patterns, but since holes are formed even at unnecessary portions, wiring design must be performed to avoid the through holes, which becomes an obstacle for realizing higher density.

In order to solve the above-mentioned prior art problem, interlayer connection had been proposed to disuse through holes and to connect only the adjacent layers via non-through holes. One example thereof is a so-called build-up method including forming build-up layers on insulating boards having circuits formed thereto, forming non-through holes with laser or the like, plating the inner walls thereof and realizing connection, wherein the necessary number of layers are built up sequentially. Techniques for interlayer connection other than the build-up method that utilize conductive paste and anisotropic conductive material have been proposed by manufacturers and are offered in the market.

For example, patent document 1 discloses a method of forming holes in nonwoven fabric, filling conductive paste therein, and laminating and adhering copper foils or circuit boards on both sides thereof, and patent document 2 discloses a method of forming bumps on a copper foil using conductive material, superposing a synthetic resin sheet, and laminating and adhering the copper foil with circuit boards. Further, patent document 3 discloses a method for realizing interlayer connection using solder, sequentially forming metal projections and solders on wiring terminal portions of circuit patterns, arranging the circuit patterns so that the solders are opposed, and melting the solders to realize electrical connection. Moreover, patent document 4 discloses a double-sided printed board in which conductive resin composition with a specific composition is filled in via holes formed on an insulating substrate, and the conductive resin composition is hardened in the via holes so that the upper and lower electrode layers on the surfaces of the insulating substrate are electrically connected.

Patent document 1: Japanese Patent Application Laid-Open Publication No. 10-200258
Patent document 2: Japanese Patent Application Laid-Open Publication No. 10-79579
Patent document 3: Japanese Patent Application Laid-Open Publication No. 5-90763
Patent document 4: Japanese Patent No. 3038210

SUMMARY OF THE INVENTION

Problem to be Solved by the Present Invention

The mainstream of methods for mounting components is surface mounting, but some methods utilize pin-inserting components and connectors in combination, so that there are cases in which through holes or non-through holes having depths sufficient for inserting pins must be formed. However, according to the prior art technique, a multilayer wiring board having a combination of interlayer connections and connections realized via through holes is manufactured by connecting interlayers via non-through holes, and then forming through holes and plating the inner walls thereof as needed. In a typical build-up method, since the build-up layers are formed in sequential manner, if through holes exist when forming the build-up layers, the holes are filled by the build-up material.

If interlayer connecting members are used, the circuits and copper foils that come in contact with the interlayer connecting members must be flat, wherein if connection is to be performed with through holes, a method can be adopted including filling the through holes, plating the upper portion thereof and flattening the surface thereof, or circuits can be drawn out from the through holes for connection at the drawn-out portions to realize interlayer connection. Furthermore, through holes are formed at necessary portions and the inner walls thereof are plated so as to form a multilayer wiring board including both through holes and interlayer connections. Moreover, if conductive paste is used, electrical connection is maintained by performing lamination under a high pressure condition, such as 5 MPa as disclosed in the embodiment of patent document 4, or 4 MPa as disclosed in patent document 2. Therefore, in order to provide hollow through holes to the printed board for connection, the stress of pressure applied during lamination cases damage to the plated portions on the inner walls of the through holes, which may deteriorate reliability and cause disconnection during lamination.

As described, according to the prior art interlayer connecting method, it is difficult to form through holes simultaneously when forming interlayer connections between circuits, and therefore, through holes must be formed by an independent process. Further, it was difficult to leave through holes of at least one of the two printed boards after lamination to form hollow non-through holes. The present invention enables to provide a method for manufacturing multilayer wiring boards capable of efficiently forming hollow non-through holes or through holes simultaneously as realizing interlayer connection without damaging the plated portions on the inner walls of the through holes.

Means to Solve the Problem

The method for manufacturing a multilayer wiring board according to the present invention includes the following characteristic points:

1. a first printed board having a pad portion is opposed to a second printed board having a pad portion, a wiring including a wiring portion and a bump mounting pad, and a board portion, the pad portion of the first printed board and the bump mounting pad of the second printed board are connected via a solder bump, the other connecting portions are adhered via an insulating adhesive, and at least a portion of the through holes formed to at least either the first printed board or the second printed board has a hollow structure, the method comprising:
   a step of forming a solder bump using a solder paste to at least either the pad portion of the first printed board or the bump mounting pad of the second printed board; and
   a step of laminating and adhering the first printed board and the second printed board by placing an insulating adhesive between the first printed board and the second printed board to thereby electrically connect the first printed board and the second printed board;
2. the size of the height of the solder bump is greater than the thickness of the insulating adhesive and smaller than four times the thickness of the insulating adhesive;
3. the insulating adhesive utilizes an insulating adhesive film having through holes formed in advance at positions corresponding to the solder bumps;
4. during lamination and adhesion, the fluidity of the insulating adhesive is within the range of 1 to 300 μm;
5. during lamination and adhesion, the temperature during Lamination and adhesion is within the range between a melting point of solder paste and the melting point of solder paste plus 40° C., and the pressure during lamination and adhesion is 1.5 MPa or smaller;
6. further comprising a step of forming a through hole at a given position where the first printed board, the second printed board and the insulating adhesive overlap when they are aligned, and a step of inserting a pin at least 0.1 mm shorter than a total thickness of the first printed board, the second printed board and the insulating adhesive to the through hole;
7. further comprising a step of providing an insulating resin layer on a base material and a circuit pattern excluding the circuit pattern on which solder bumps are formed on a connecting surface on which solder bumps are formed on at least one printed board, and a step of providing an insulating resin layer on a base material excluding a circuit pattern on a connecting surface of the other printed board;
8. the insulating resin layer is formed of photosensitive resin;
9. the sizes of the first printed board and the second printed board differ;
10. at least a portion of the through holes formed by drilling necessary portions of at least one printed board and metal-plating the inner walls thereof has at least two hole diameters included in a single through hole;
11. at least a portion of the through holes from which circuit patterns on which solder bumps are formed are drawn out has at least two hole diameters included in a single through hole;
12. a first printed board having a pad portion is opposed to a second printed board having a pad portion, a wiring including a wiring portion and a bump mounting pad, and a board portion, the pad portion of the first printed board and the bump mounting pad of the second printed board are connected via a solder bump, the other connecting portions are adhered via an insulating adhesive, and at least a portion of the through holes formed to at least either the first printed board or the second printed board has a hollow structure, the method comprising:
a step of forming a solder bump using a solder paste to at least either the bump mounting pad of the first printed board or the pad portion of the second printed board; and
a step of laminating and adhering the first printed board and the second printed board by placing an insulating adhesive between the first printed board and the second printed board to thereby electrically connect the first printed board and the second printed board; wherein
the size of the height of the solder bump is greater than the thickness of the insulating adhesive and smaller than four times the thickness of the insulating adhesive;
during lamination and adhesion, the temperature during lamination and adhesion is within the range between a melting point of solder paste and the melting point of solder paste plus 40° C., and the pressure during lamination and adhesion is 1.5 MPa or smaller; and the method further comprising a step of providing an insulating resin layer on a base material and a circuit pattern excluding the circuit pattern oh which solder bumps are formed on a connecting surface on which solder bumps are formed on at least one of the printed boards, and a step of providing an insulating resin layer on a base material excluding a circuit pattern on a connecting surface of the other printed board;
13. the insulating adhesive utilizes an insulating adhesive film having through holes formed in advance at positions corresponding to the solder bumps;
14. during lamination and adhesion, the fluidity of the insulating adhesive is within the range of 1 to 300 μm;
15. a step of forming a through hole at a given position where the first printed board, the second printed board and the insulating adhesive overlap when they are aligned, and a step of inserting a pin at least 0.1 mm shorter than a total thickness of the first printed board, the second printed board and the insulating adhesive to the through hole;
16. the insulating resin layer is formed of photosensitive resin;
17. the sizes of the first printed board and the second printed board differ;
18. at least a portion of the through holes formed by drilling necessary portions of at least one printed board and metal-plating the inner walls thereof has at least two hole diameters included in a single through hole;
19. at least a portion of the through holes from which circuit patterns on which solder bumps are formed are drawn out has at least two hole diameters included in a single through hole.

Effect of the Present Invention

According to the present invention, it becomes possible to manufacture multilayer wiring boards capable of electrically connecting two printed boards efficiently while simultaneously forming hollow non-through holes or through holes without damaging the plated portions on the inner walls of the through holes.

Figure 1:
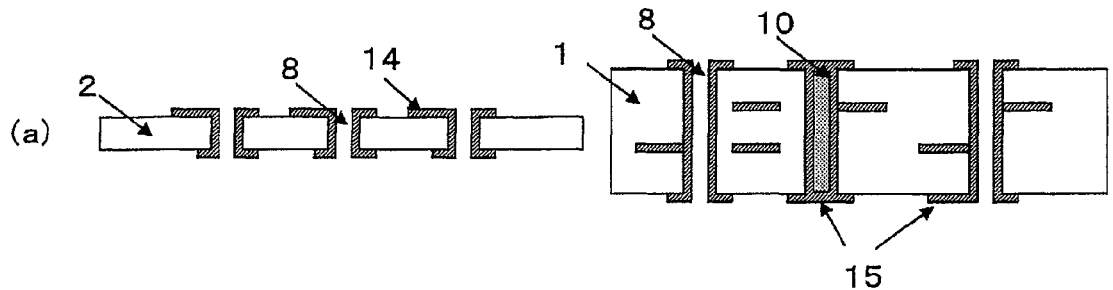
FIG. 1 is a cross-sectional view of step (a) of the method for manufacturing a multilayer wiring board according to the present invention.

EXPLANATION OF REFERENCE NUMBERS 1 first printed board
2 second printed board
3 solder bump
4 insulating adhesive
5 insulating adhesive with holes
6 pin
7 insulating resin layer
8 through hole
9 stepped through hole
10 filled through hole
11 hollow portion
12 omitted portion of multilayer wiring board
13 anisotropic conductive film
14 bump mounting pad
15 pad portion

BEST MODE FOR CARRYING OUT THE INVENTION

Now, the preferred embodiments for carrying out the method for manufacturing a multilayer wiring board according to the present invention will be described with reference to the drawings, but the preferred embodiments are not meant to restrict the range of the present invention.

At first, the steps of the manufacturing method according to the present invention will be described with reference to FIGS. 1 through 4. As illustrated in FIG. 1, a first printed board 1 and a second printed board 2 are manufactured (manufacturing step (a)). The respective printed boards 1 and 2 can be a double-sided circuit board, a multilayer wiring board or a multiwire wiring board. Any type of material can be used as base material for the printed board, but in order to suppress deformation via heat and pressure during lamination, it is preferable to use an insulating base material containing glass cloth or other reinforcement, and more specifically, it is preferable to use an FR (frame retardant)-5 grade base material or polyimide resin-based material or other base material having high Tg (glass transition point).

The second printed board comprises a wiring including pad portions, wiring portions and bump mounting pads 14, and a board portion. Further, the first printed board includes pad portions 15, and it can also include wiring portions, bump mounting pads, or wires including the same.

Figure 2:
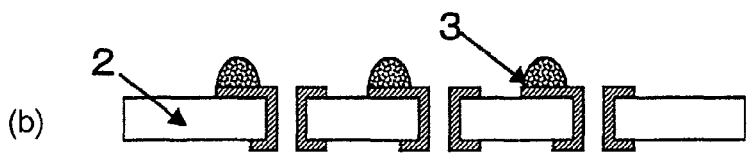
FIG. 2 is a cross-sectional view of step (b) of the method for manufacturing a multilayer wiring board according to the present invention.

Next, as illustrated in FIG. 2, solder paste is printed on at least one of the printed boards (for sake of explanation, the second printed board 2 is used in the present description), which is subjected to reflow processing to form solder bumps (manufacturing step (b)). At this time, pads are preferably formed via metal foils and the like at portions where the bumps are to be formed via solder paste. If there are through holes at portions where the bumps are formed, the solder may easily flow into the through holes, and the bump height becomes difficult to control, so that it is preferable for pads to be drawn out of the through holes.

Solder paste is printed via general screen printing methods or dispensing methods. Solder bumps are referred to as "solder bumps" or "bumps".

The pad portions of the first printed board include pads, figures formed by providing through holes and plating the inner walls thereof to form lands, land figures formed by providing through holes, plating the inner walls thereof, filling the holes and applying top plating, and bump mounting pads if bump mounting pads are required. The bump mounting pads of the second printed board are electrically connected via solder bumps to the pads portions of the first printed board, thereby forming bump connecting portions.

Any type of solder paste can be used, such as a common eutectic solder, a low melting solder, a high-temperature solder and a lead-free solder. The type of flux contained in the solder paste is also unlimited, and it can be soluble or non-soluble. The melting point of solder can be obtained via endothermic peaks measured under nitrogen atmosphere using DSC (differential scanning calorimetry).

Next, the size of the height of the solder bumps 3 should preferably be greater than the size of the thickness of the insulating adhesive and smaller than four times the size of the thickness of the insulating adhesive, and more preferably, be two to three times the size of the thickness of the insulating adhesive. If the size of the height of the solder bumps 3 is smaller than the size of the thickness of the insulating adhesive, the solder bumps will not contact the opposing contact locations, and contact failure is likely to occur. If the size of the height of the solder bumps 3 is greater than four times the size of the thickness of the insulating adhesive, the insulating adhesive will not come into contact with at least one of the printed boards and a gap will be formed, allowing the solder to ooze through the gap and contact other adjacent circuits if any, causing short circuit.

Figure 3:
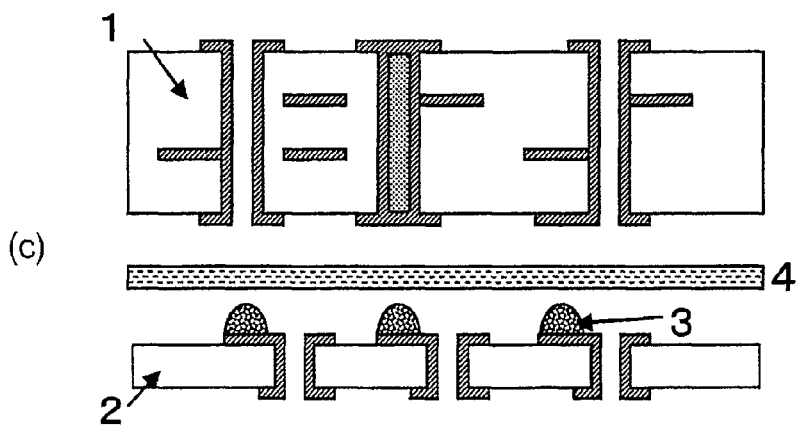
FIG. 3 is a cross-sectional view of step (c) of the method for manufacturing a multilayer wiring board according to the present invention.

Next, as shown in FIG. 3, an insulating adhesive 4 is placed between two printed boards (manufacturing step (c)). The insulating adhesive 4 can be obtained by directly applying insulating varnish on the printed board via printing and drying the same, but in order to reduce processing steps, it is preferable to use film materials. Any type of film material can be used as long as it is an adhesive having insulating property, but it is preferable for the film material to have controllable fluidity and formed of resin compositions containing polymer components. Moreover, the insulating adhesive 4 should preferably be formed of thermosetting resin. Examples of insulating adhesives include AS-3000 (trade name, manufactured by Hitachi Chemical Co. Ltd.) and ABF-SH (trade name, manufactured by Ajinomoto Fine-Techno Co., Inc.). The thickness of the insulating adhesive is not restricted, but it should preferably be within the range of 50 to 100 µm. In the case of film materials, the handling property of the film itself is deteriorated if the thickness thereof is less than 50 µm. However, the application property of the film may be deteriorated if the thickness exceeds 100 µm.

Figure 4:
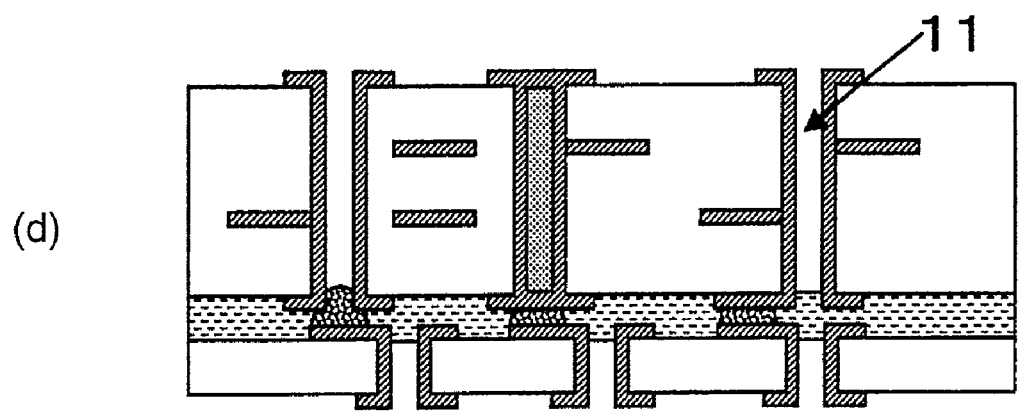
FIG. 4 is a cross-sectional view of step (d) of the method for manufacturing a multilayer wiring board according to the present invention.

Next, the printed boards are laminated and adhered as shown in FIG. 4. At this time, the areas of the contact surfaces of the first printed board 1 and the second printed board 2 excluding the bump connection portions, that is, the areas excluding the bump mounting pads of the first printed board and the pad portions of the second printed board related to electrical connection are laminated and adhered via the insulating adhesive, and the bump connecting portions are electrically connected via solder (manufacturing step (d)). Actually, the areas excluding the bump mounting pads of the first printed board and the pad portions of the second printed board related to electrical connection are the circuit patterns excluding the bump mounting pads, the exposed base material and resist surface. At this time, the solder bumps break through the insulating adhesive and realize electrical connection.

The laminating and adhering step should preferably be performed under a laminating condition in which the temperature range during lamination and adhesion is from the melting point of solder paste to the melting point of solder paste plus 40° C. with a pressure of 1.5 MPa or smaller, and it is more preferably performed under a laminating condition in which the temperature range during lamination and adhesion is from the melting point of solder paste to the melting point of solder paste plus 20° C. with a pressure of 1 MPa or smaller. If the temperature during lamination and adhesion is below the melting point of solder paste, the solder will not melt, and the circuit connection will mainly be realized physically and not via molten solder connection, by which the connection properties may be deteriorated. On the other hand, if the temperature exceeds the melting point of solder paste plus 40° C., the solder will melt completely, so that when the solder is connected to the through hole, solder will flow along the plated inner wall surface, making it difficult to leave the through hole completely hollow.

Furthermore, when the pressure exceeds 1.5 MPa, the pressure applied to the solder becomes too high, causing the solder bumps to deform or be easily subjected to cracks and damages, or the pressure may damage the through holes of the printed board, causing deteriorated reliability and disconnection during lamination.

Figure 5:
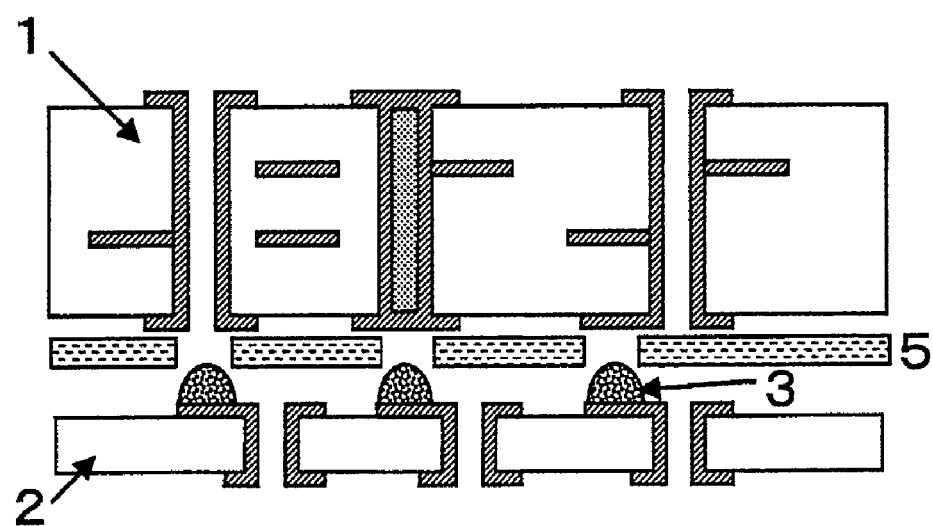
FIG. 5 is a cross-sectional view illustrating another preferred embodiment of the present invention.

Further, as shown in FIG. 5, it is preferable to use an insulating adhesive 5 having holes formed in advance at positions corresponding to solder bumps 3. The holes can be processed via any means, such as laser, drilling and punching. By forming holes to the insulating adhesive 5, the solder bumps 3 will protrude above the adhesive 5 during the aligning step prior to lamination, so the process of breaking through the insulating adhesive 5 via the solder bumps 3 becomes unnecessary. Therefore, the two printed boards can be electrically connected in a more secure manner.

Further, the fluidity of the insulating adhesive 5 should preferably be within the range of 1 to 300 μm under the laminating and adhering condition, and it should more preferably be within 1 to 150 μm. If the fluidity is smaller than 1 μm, sufficient adhesive property cannot be obtained since the insulating adhesive 5 does not get wet sufficiently to the printed board, while on the other hand, if the fluidity is greater than 300 μm, resin will flow into spaces between the solder bumps 3 and the connecting circuits, possibly causing disconnection. In case a material having high fluidity is to be used, if the material is composed of thermosetting resin, preheating should be performed before the lamination and adhesion step, so as to harden the material to realize the desired fluidity. If the material is composed of thermoplastic resin, the desired fluidity can be realized, for example, by increasing the molecular weight or by reducing the volatile portions. The fluidity is computed by measuring the hole diameter of the holes formed in advance to the insulating adhesive 5, superposing the insulating adhesive 5 on the copper-clad laminate, further superposing a copper foil and performing lamination under a lamination and adhesion condition, etching and removing the copper foil and measuring the hole diameter of the insulating adhesive 5 thereafter to obtain the difference between the hole diameters before and after lamination.

Figure 6:
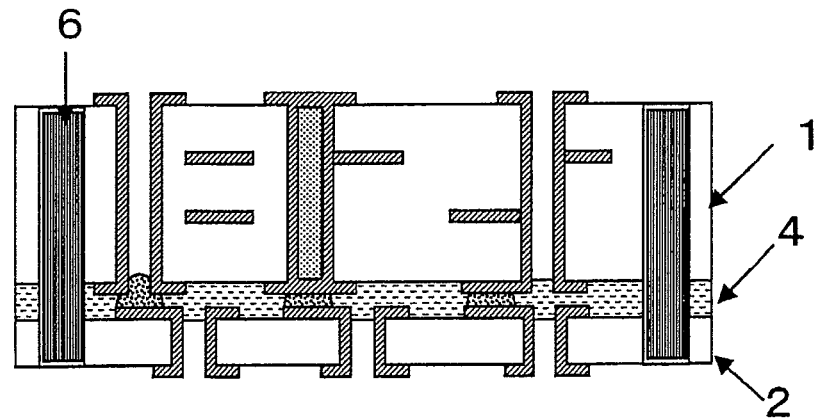
FIG. 6 is a cross-sectional view illustrating another preferred embodiment of the present invention.

Further, as shown in FIG. 6, it is preferable to provide holes on the first printed board 1, the second printed board 2 and the insulating adhesive 4 at given corresponding positions when aligned, and to insert pins 6 at least 0.1 mm shorter than the total thickness of the first printed board 1, the second printed board 2 and the insulating adhesive 4 in the holes for lamination. By inserting pins 6, it becomes possible to facilitate alignment of the boards 1 and 2 and the insulating adhesive 4 for lamination, and to eliminate displacement. Further, by using pins 6 that are at least 0.1 mm shorter than the total thickness, it becomes possible to prevent pins 6 from protruding from the board during lamination, and to perform lamination using normal laminated paneling.

Figure 7:
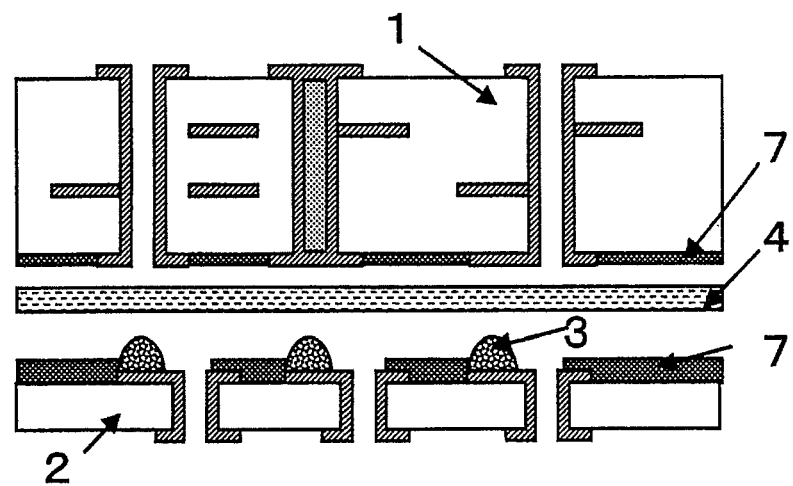
FIG. 7 is a cross-sectional view illustrating another preferred embodiment of the present invention.

Moreover, as shown in FIG. 7, it is preferable to apply an insulating resin layer 7 on the surface on which bumps 3 are formed of at least one of the printed boards 2 at areas of the circuit pattern excluding the circuit pattern on which the bumps 3 are formed and the base member, and to apply an insulating resin layer 7 on the surface of the base member excluding the circuit pattern of the other printed board 1. By forming bumps 3 on the circuit and forming an insulating resin layer 7 on the circuit pattern excluding the portions where the bumps 3 are formed, it becomes possible to prevent solder from sticking onto unnecessary areas on the circuit. Further, when an insulating resin layer 7 is provided on the circuit pattern of the other printed board 1, according to some circuit patterns, there may be areas where the insulating resin layer 7 is overlapped on the circuit pattern, according to which the distance between the first printed board 1 and the second printed board 2 is varied and unconnected portions may occur.

Moreover, the insulating resin layer is preferably formed of photosensitive resin. If thermosetting resin is used, it is possible to apply methods such as screen printing using a printed plate with a mask or coating resin on the whole surface and then using laser to expose the circuit on which solder bumps are formed. It is more preferable to use photosensitive resin, since circuits can be exposed easily by coating resin on the whole surface, exposing the same and subjecting the same to wet processing.

According to the above-described method for manufacturing a multilayer wiring board, it is possible to leave the through holes on the first printed board 1 and the second printed board 2 hollow, so that non-penetrated through holes can be formed easily, and by forming through holes on the corresponding positions of the first printed board 1 and second printed board 2 and by forming holes on corresponding position on the insulating adhesive 4, it becomes possible to utilize them as through holes after adhesion. Therefore, through holes can be formed simultaneously while performing interlayer connection.

Figure 8:
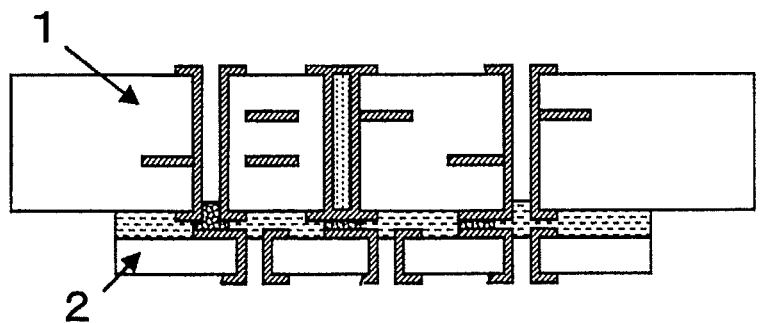
FIG. 8 is a cross-sectional view illustrating another preferred embodiment of the present invention.

Further, as shown in FIG. 8, the first printed board 1 and the second printed board 2 can be of the same size or different sizes, and the boards can be of various sizes and shapes.

Figure 9:
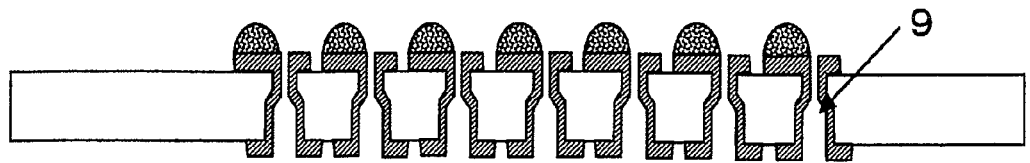
FIG. 9 is a cross-sectional view illustrating another preferred embodiment of the present invention.

Moreover, if the interval between through holes near the areas of the bump connecting portions of the first printed board and the second printed board 2 is smaller than 1 mm, the area for forming the pad drawn out from the through hole for forming the solder bump is reduced, and the adjacent circuits contact one another. If an inserting pin is to be inserted to the relevant through hole, the diameter size of the through hole cannot be smaller. In this case, as shown in FIG. 9, by forming stepped through holes having a smaller hole diameter on the side in which pads for forming solder bumps are formed, it becomes possible to maintain a hole diameter suitable for inserting pins while increasing the interval between through holes and ensuring an area for forming pads on the small-diameter hole portion, so that the problem of narrow space between through holes can also be solved. The stepped through holes can be processed by forming a small-diameter through hole, and then forming a large-diameter hole having the necessary depth on the same position.

Further, the end of the drill for processing the large-diameter hole can be of any shape, but it is preferable to use a conical cutting blade in which the angle of the cutting blade is acute-angled. As shown in FIG. 9, the bottom portion (taper) of the large-diameter hole portion of the stepped through hole is slanted to an angle equivalent to the angle of the cutting blade. When plating is applied to the inner walls of the holes, the plating liquid may accumulate at the corner of the stepped portion as the taper angle is increased (and approximates 90° C.), which may cause thin plating or cause concentration of stress to the acute-angled corner of the formed plate during application of pressure for adhesion, possibly leading to disconnection.

Further, second through holes can be formed at intervals ensuring areas for drawing out wires out of the areas outside the narrow-interval area and forming pads via inner layer circuits from through holes in which the inserting pins are inserted in the printed board on which solder bumps are formed. It is preferable to narrow down the interval of through holes for inserting pins by drawing out pads from the second through hole, forming solder bumps for electrical connection and realizing electrical connection with the other printed board. These arrangements can be selected according to need either alone or in combination.

As described, the present invention enables to provide a method for manufacturing a multilayer wiring board capable of simultaneously forming hollow non-through holes and through holes easily while electrically connecting printed boards via solder. Further, the manufacturing method according to the present invention can preferably be applied to manufacturing a probe board for measuring the various electrical properties of LSI chips or other semiconductor devices.

EXAMPLE 1

Figure 10:
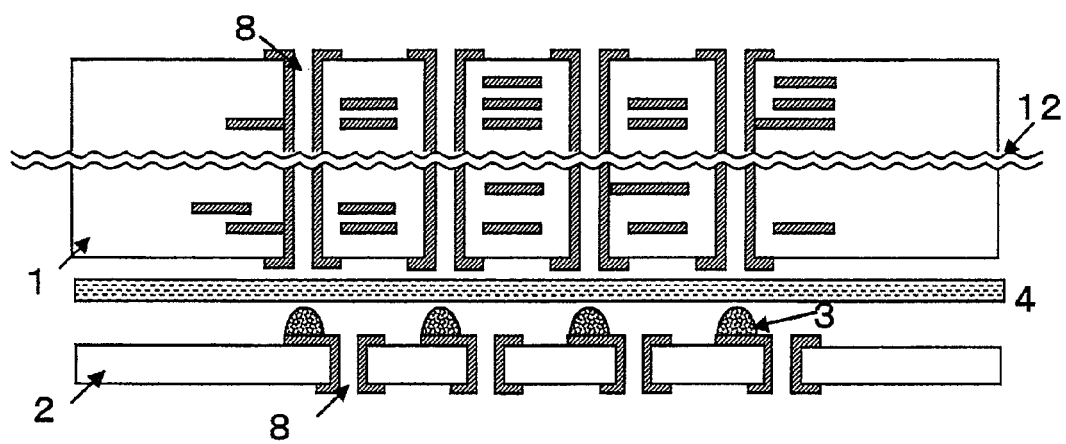
FIG. 10 is a cross-sectional view illustrating example 1 of the present invention.

FIG. 10 is a cross-sectional explanatory view illustrating the arrangement according to example 1 of the present invention.

An etching resist is formed on the surface of a copper foil of an MCL-I-671 (trade name, manufactured by Hitachi Chemical Co. Ltd.) with a thickness of 0.1 mm, which is a polyimide-based double-sided copper-clad laminates, then the unnecessary portions of the copper foil is removed via etching to form a double-sided circuit board. Ten double-sided circuit boards are formed, and GIA-671 (trade name, manufactured by Hitachi Chemical Co. Ltd.) with a thickness of 0.05 mm, which is a polyimide-based glass cloth prepreg, is sandwiched therebetween to laminate and adhere the boards. Next, through holes are formed at necessary portions for connection using a drill with a diameter of Ø0.35 at 1.6 mm hole intervals, and the inner walls thereof are plated to form a multilayer wiring board with twenty layers as the first printed board 1.

Further, through holes are formed on an MCL-I-671 with a thickness of 1.6 mm using a drill with a diameter of Ø0.45 at 1.6 mm hole intervals, the inner walls thereof are plated, an etching resist is formed on the surface of the copper foil, and unnecessary copper foil is removed via etching to form a multilayer wiring board with two layers as the second printed board 2. The first printed board 1 and the second printed board 2 are both 500-mm square.

Solder bumps 3 having a height of 100 μm is obtained by printing solder paste (eutectic solder, melting point 183° C.) on the surface of the second printed board 2 facing the first printed board 1 at positions connected to through holes of the first printed board 1, and subjecting the same to a reflow process. There are 5000 points of connection of solder bumps 3.

An AS-3000 having a thickness of 50 μm and an average resin fluidity of 150 μm is arranged as the insulating adhesive 4 between the first printed board 1 and the second printed board 2, which is then laminated and adhered under the following condition; 200° C., 1 MPa and 30 minutes. As a result, all 5000 points are connected in a satisfying manner, and the resistance per single connection of the solder bump is approximately 10 mΩ, according to which a good electrical connection is obtained. Furthermore, at portions where the solder bumps are connected to the through hole of the first printed board 1, the solder bumps enter the through hole for only approximately 0.1 mm, leaving a hollow structure with a depth of 1.5 mm, and since the through holes of the second printed board 2 have a hollow structure, non-penetrating through holes of the multilayer wiring board can be formed simultaneously from the respective through holes.

EXAMPLE 2

Figure 11:
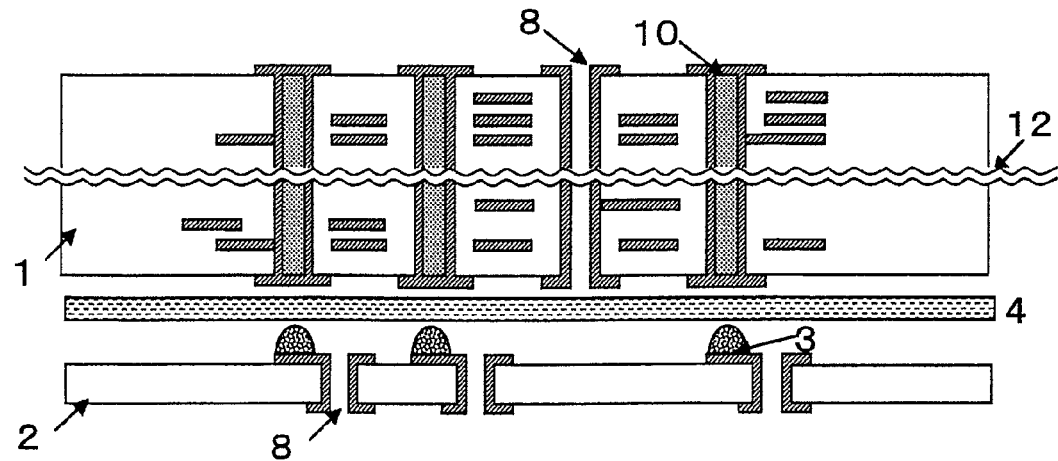
FIG. 11 is a cross-sectional view illustrating example 2 of the present invention.

FIG. 11 is across-sectional view illustrating the structure according to example 2 of the present invention. In example 2, the through holes of the first printed board 1 electrically connected to the solder bumps of the second printed board 2 in example 1 are filled with epoxy resin-based material and the surfaces thereof are plated so as to form a multilayer wiring board of twenty layers having the through holes thereof filled, but other than that, example 2 is formed in the same manner as example 1.

As a result, all 5000 points were electrically connected, and the resistance per single solder bump 1 was approximately 5 mΩ, according to which a superior connecting performance was obtained. Further, non-penetrating through holes were formed simultaneously by leaving the through holes of the first printed board not being connected electrically and the through holes of the second printed board in a hollow state.

EXAMPLE 3

Figure 12:
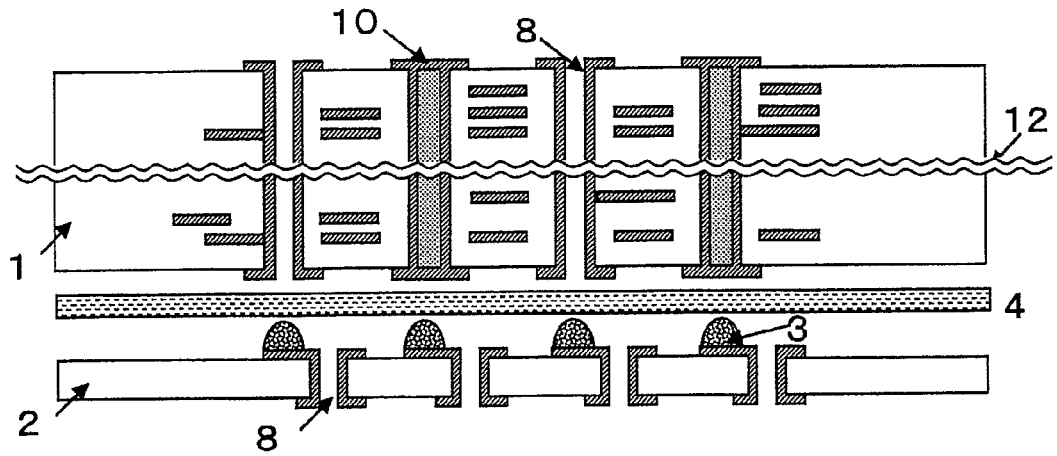
FIG. 12 is a cross-sectional view illustrating example 3 of the present invention.

FIG. 12 is across-sectional view illustrating the structure according to example 3 of the present invention.

In the present example, 2500 holes out of the 5000 through holes formed to the second printed board in example 1 are filled with epoxy resin-based material, the surfaces of which are plated to form a twenty-layer multilayer wiring board, but other than that, it is formed in the same manner as example 1.

As a result, all 5000 points were electrically connected, and the resistance per single connected solder bump 1 was approximately 7 mΩ, according to which a superior connecting performance was obtained. Furthermore, at portions where the solder bumps are connected to the through holes of the first printed board 1 that have not been filled and plate-covered, the solder bumps enter the through hole for only approximately 0.1 mm, leaving a hollow structure with a depth of 1.5 mm, and since the through holes of the second printed board 2 have a hollow structure, non-penetrating through holes of the multilayer wiring board can be formed simultaneously via the respective through holes.

EXAMPLE 4

A double-sided circuit board is manufactured by forming an etching resist on a copper foil on the surface of an MCL-I-671 having a thickness of 0.1 mm, and etching the unnecessary areas of the copper foil. Five double-sided boards are formed in this manner, and GIA-671 having a thickness of 0.05 mm are sandwiched therebetween, then the boards are laminated. Thereafter, through holes are formed at portions necessary for connection using a drill with a diameter of Ø0.3, and the inner walls thereof are plated to form a ten-layer multilayer wiring board. Then, two ten-layer multilayer wiring boards are laminated via two prepregs with a thickness of 0.05 mm, and through holes are further formed at portions necessary for connection using a drill with a diameter of Ø0.35, and the inner walls thereof and portions of the through holes of the ten-layer multilayer wiring board having been rein-filled with prepreg are plated to form a twenty-layer multilayer wiring board with via holes as the first printed board. At this time, the interval distance between the via holes and through holes is 1.6 mm. In the present example, the first printed board in Example 1 is a twenty-layer multilayer wiring board with via holes, but other than that, the present example is formed in the same manner as example 1. As a result, all 5000 points were electrically connected, and the resistance per single solder bump 1 connection was approximately 7 m$\Omega$, according to which a superior connecting performance was obtained. Furthermore, at portions where the solder bumps are connected to the through holes of the first printed board 1, the solder bumps enter the through hole for only approximately 0.1 mm, leaving a hollow structure with a depth of 1.5 mm, and since the through holes of the second printed board 2 have a hollow structure, non-penetrating through holes of the multilayer wiring board could be formed simultaneously via the respective through holes.

EXAMPLE 5

Other than setting the height of the solder bump to 50 μm, the present example was formed in the same manner as example 1. As a result, all 5000 points were electrically connected, and the resistance per single solder bump 1 connection was approximately 8 m$\Omega$, according to which a superior result was obtained.

EXAMPLE 6

Other than setting the height of the solder bump to 50 μm, the present example was formed in the same manner as example 2. As a result, all 5000 points were electrically connected, and the resistance per single solder bump 1 connection was approximately 8 m$\Omega$, according to which a superior result was obtained.

EXAMPLE 7

Other than setting the height of the solder bump to 50 μm, the present example was formed in the same manner as example 3. As a result, all 5000 points were electrically connected, and the resistance per single solder bump 1 connection was approximately 8 m$\Omega$, according to which a superior result was obtained.

EXAMPLE 8

Other than setting the height of the solder bump to 200 μm, the present example was formed in the same manner as example 1. As a result, all 5000 points were electrically connected, and the resistance per single solder bump 1 connection was approximately 7 m$\Omega$, according to which a superior result was obtained.

EXAMPLE 9

Other than setting the height of the solder bump to 200 μm, the present example was formed in the same manner as example 2. As a result, all 5000 points were electrically connected, and the resistance per single solder bump 1 connection was approximately 7 m$\Omega$, according to which a superior result was obtained.

EXAMPLE 10

Other than setting the height of the solder bump to 200 μm, the present example was formed in the same manner as example 3. As a result, all 5000 points were electrically connected, and the resistance per single solder bump 1 connection was approximately 7 m$\Omega$, according to which a superior result was obtained.

EXAMPLE 11

Other than setting the thickness of the insulating adhesive to 100 μm, the present example was formed in the same manner as example 8. As a result, all 5000 points were electrically connected, and the resistance per single solder bump 1 connection was approximately 9 m$\Omega$, according to which a superior result was obtained.

EXAMPLE 12

Other than setting the thickness of the insulating adhesive to 100 μm, the present example was formed in the same manner as example 9. As a result, all 5000 points were electrically connected, and the resistance per single solder bump 1 connection was approximately 9 m$\Omega$, according to which a superior result was obtained.

EXAMPLE 13

Other than setting the thickness of the insulating adhesive to 100 μm, the present example was formed in the same manner as example 10. As a result, all 5000 points were electrically connected, and the resistance per single solder bump 1 connection was approximately 9 m$\Omega$, according to which a superior result was obtained.

EXAMPLE 14

Other than utilizing an AS-3000 having a thickness of 50 μm and an average resin fluidity of 50 μm having holes formed at positions corresponding to the solder bumps of the first printed board as insulating adhesive, the present example was formed in the same manner as example 1. As a result, all 5000 points were electrically connected, and the resistance per single solder bump 1 connection was approximately 5 m$\Omega$, according to which a superior result was obtained.

EXAMPLE 15

Other than utilizing an MCL-E-679, which is an epoxy-based copper-clad laminates, as the laminated board, and utilizing an E-679, which is an epoxy-based glass epoxy prepreg, as prepreg, the present example was formed in the same manner as example 1. As a result, all 5000 points were electrically connected, and the resistance per single solder bump 1 connection was approximately 10 mΩ, according to which a superior result was obtained.

EXAMPLE 16

Other than utilizing a ten-layer multilayer wiring board as the second printed board, the present example was formed in the same manner as example 1. As a result, all 5000 points were electrically connected, and the resistance per single solder bump 1 connection was approximately 10 mΩ, according to which a superior result was obtained.

EXAMPLE 17

Other than utilizing an ABF-SH (trade name, manufactured by Ajinomoto Fine-Techno Co., Inc.) having a thickness of 50 μm and an average resin fluidity of 250 μm as insulating adhesive, the present example was formed in the same manner as example 1. As a result, all 5000 points were electrically connected, and the resistance per single solder bump 1 connection was approximately 10 mΩ, according to which a superior result was obtained. Furthermore, at portions where the solder bumps are connected to the through holes of the first printed board 1, the solder bumps enter the through hole for only approximately 0.5 mm, leaving a hollow structure with a depth of 1 mm, and since the through holes of the second printed board 2 are hollow, non-penetrating through holes of the multilayer wiring board were formed simultaneously from the respective through holes.

EXAMPLE 18

Other than utilizing as insulating adhesive an ABF-SH having a thickness of 50 μm and an average resin fluidity of 400 μm which is subjected to preheating in 80° C. for 20 minutes before lamination so as to set the resin fluidity to 250 μm, the present example was formed in the same manner as example 1. As a result, all 5000 points were electrically connected, and the resistance per single solder bump 1 connection was approximately 11 mΩ, according to which a superior result was obtained. Furthermore, at portions where the solder bumps are connected to the through holes of the first printed board 1, the solder bumps enter the through hole for only approximately 0.2 mm, leaving a hollow structure with a depth of 1.4 mm, and since the through holes of the second printed board are hollow, non-penetrating through holes of the multilayer wiring board were formed simultaneously from the respective through holes.

EXAMPLE 19

Figure 13:
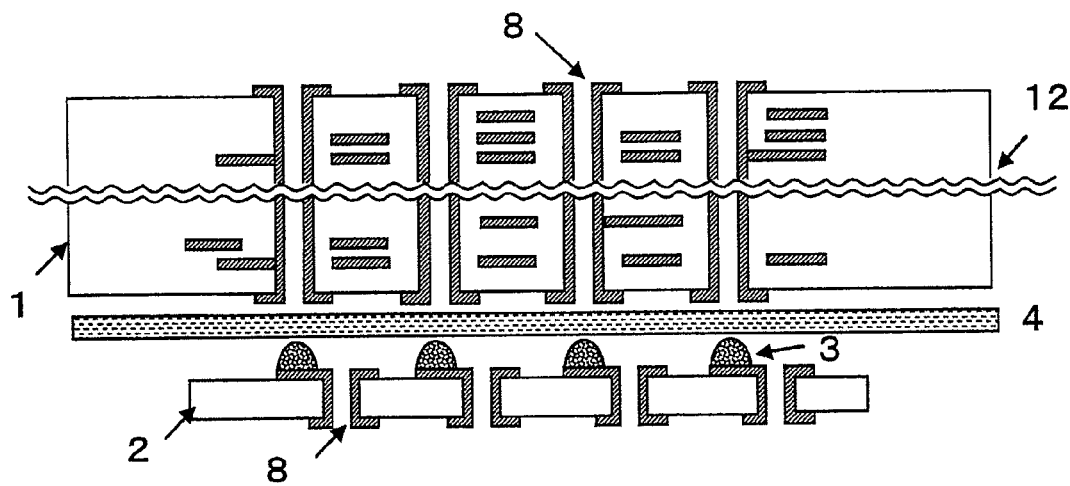
FIG. 13 is a cross-sectional view illustrating example 19 of the present invention.

FIG. 13 is a cross-sectional view illustrating a structure according to embodiment 19 of the present invention. Other than utilizing a second printed board 2 having a 300-mm square size, the present example was formed in the same manner as example 1. As a result, all 5000 points were electrically connected, and the resistance per single solder bump 1 connection was approximately 10 mΩ, according to which a superior electrical connection was obtained. Furthermore, at portions where the solder bumps are connected to the through holes of the first printed board 1, the solder bumps enter the through hole for only approximately 0.1 mm, leaving a hollow structure with a depth of 1.5 mm, and since the through holes of the second printed board 2 are hollow, non-penetrating through holes of the multilayer wiring board were formed simultaneously from the respective through holes.

EXAMPLE 20

Figure 14:
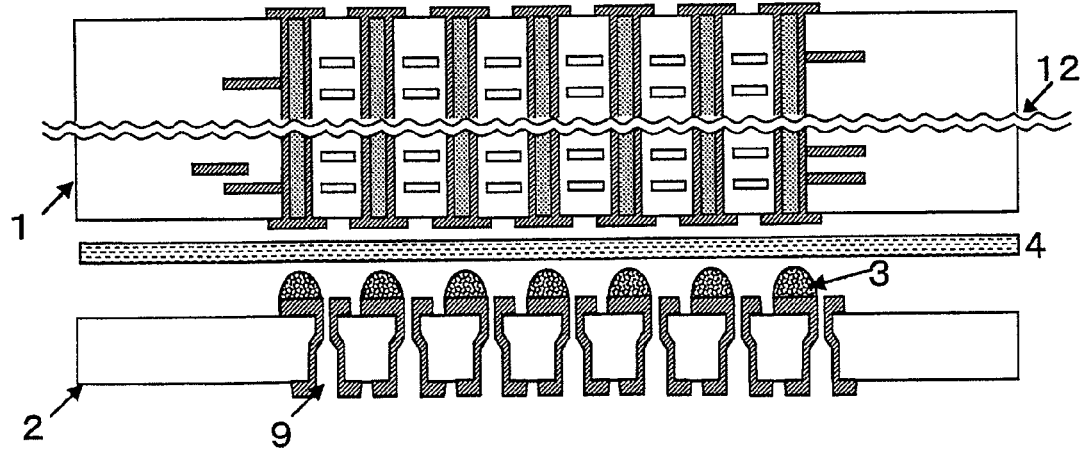
FIG. 14 is a cross-sectional view illustrating example 20 of the present invention.

FIG. 14 is a cross-sectional view illustrating a structure according to embodiment 20 of the present invention. Through holes of the first printed board 1 were formed using a drill with a diameter of Ø0.3 with 0.8 mm intervals between holes, the inner walls of the through holes were plated, the through holes were filled with epoxy-based material, and the surface thereof was covered via plating to form a twenty-layer multilayer wiring board. A board having through holes with varied hole diameters is used as the second printed board 2, wherein the hole diameter at the connecting surface with the first printed board is Φ0.2 and the hole diameter at the rear surface is Φ0.45 (with 0.8 mm intervals between holes). Other conditions were the same as those of example 1.

As a result, all 5000 points were electrically connected, and the resistance per single solder bump 1 connection was approximately 10 mΩ, according to which a superior connecting performance was obtained. The through holes of the second printed board were formed to have a hollow structure. Further, the through holes were formed with an interval that is half the interval between holes of examples 1 through 19, allowing the same number of connecting points to be connected in approximately one-fourth the area, thus the present invention advantageously minimizes the area of connection by minimizing the interval between holes.

EXAMPLE 21

Figure 15:
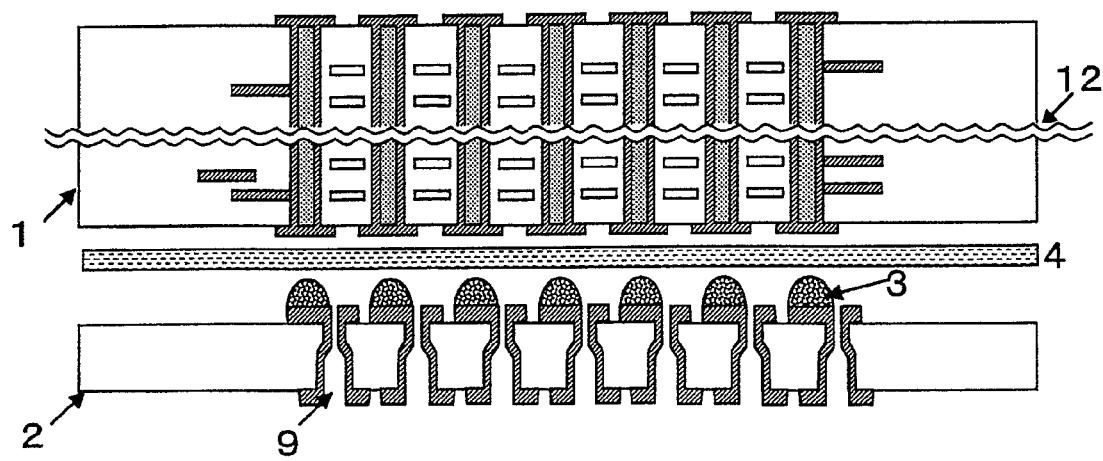
FIG. 15 is a cross-sectional view illustrating example 21 of the present invention.
Figure 16:
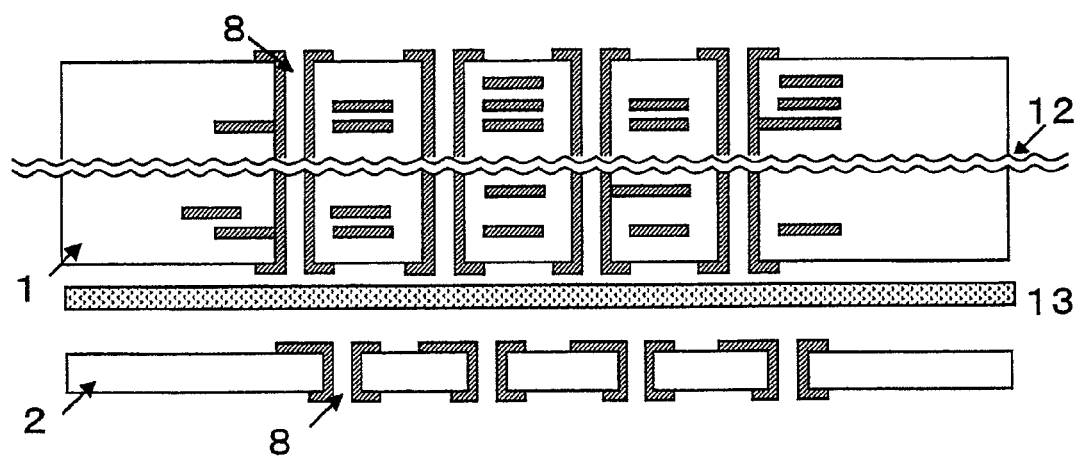
FIG. 16 is a cross-sectional view illustrating the structure of comparison example 2.

FIG. 15 is a cross-sectional view illustrating the structure according to the present invention. Other than the through holes of the first printed board 1 not being filled and not being covered with plating, the present example was formed in the same manner as example 20. As a result, all 5000 points were electrically connected, and the resistance per single solder bump 1 connection was approximately 8 mΩ, according to which a superior electrical connection was obtained. The first printed board and the second printed board were formed with through holes having a hollow structure.

The multilayer wiring boards obtained via the above-described embodiments have advantageous connecting properties, without any increase in connection resistance even after 200 times of MIL-107 (repeating 125° C., 30 min./−65° C., 30 min.) tests or five times of solder float (260° C., 20 sec) tests for testing connection reliability.

COMPARISON EXAMPLE 1

Other than not using the insulating adhesive of example 1, the present example was formed in the same manner as example 1. As a result, the solder flowed in the lateral direction, coming into contact with adjacent circuits and caused short circuit.

COMPARISON EXAMPLE 2

FIG. 15 is a cross-sectional view illustrating a structure according to comparison example 2. Other than placing an AC-7106U-25 (trade name, manufactured by Hitachi Chemical Co. Ltd.), which is an anisotropic conductive film, between the first printed board and the second printed board formed in example 1, the present example was formed in the same manner as example 1. As a result, all 5000 points were electrically connected, and the resistance per single solder bump 1 connection was good, approximately 10 mΩ, but from the viewpoint of connection reliability, there were areas where the resist was raised by a single solder float (260° C., 20 sec) test, resulting in disconnection.

As described, the present invention enables to provide a method for manufacturing a multilayer wiring board having two printed boards electrically connected via solder to realize interlayer connection while simultaneously forming through holes or non-through holes having a hollow structure.

The invention claimed is:

1. A method for manufacturing a multilayer wiring board, wherein a first printed board having a pad portion is opposed to a second printed board having a pad portion, a wiring including a wiring portion and a bump mounting pad, and a board portion, the pad portion of the first printed board and the bump mounting pad of the second printed board are connected via a solder bump, the other connecting portions are adhered via an insulating adhesive, and at least a portion of the through holes formed to at least either the first printed board or the second printed board has a hollow structure, the method comprising:
    a step of forming a solder bump using a solder paste to at least either the pad portion of the first printed board or the bump mounting pad of the second printed board; and
    a step of laminating and adhering the first printed board and the second printed board by placing an insulating adhesive between the first printed board and the second printed board to thereby electrically connect the first printed board and the second printed board.

2. The method for manufacturing a multilayer wiring board according to claim 1, wherein
    the size of the height of the solder bump is greater than the thickness of the insulating adhesive and smaller than four times the thickness of the insulating adhesive.

3. The method for manufacturing a multilayer wiring board according to claim 1, wherein the insulating adhesive utilizes an insulating adhesive film having through holes formed in advance at positions corresponding to the solder bumps.

4. The method for manufacturing a multilayer wiring board according to claim 3, wherein during lamination and adhesion, the fluidity of the insulating adhesive is within the range of 1 to 300 μm.

5. The method for manufacturing a multilayer wiring board according to claim 1, wherein during lamination and adhesion, the temperature of lamination and adhesion is within the range between a melting point of solder paste and the melting point of solder paste plus 40° C., and the pressure during lamination and adhesion is 1.5 MPa or smaller.

6. The method for manufacturing a multilayer wiring board according to claim 1, further comprising
    a step of forming a through hole at a given position where the first printed board, the second printed board and the insulating adhesive overlap when aligned, and a step of inserting a pin at least 0.1 mm shorter than a total thickness of the first printed board, the second printed board and the insulating adhesive to the through hole.

7. The method for manufacturing a multilayer wiring board according to claim 1, further comprising
    a step of providing an insulating resin layer on a base material and a circuit pattern excluding the circuit pattern on which solder bumps are formed on a connecting surface on which solder bumps are formed on at least one printed board, and a step of providing an insulating resin layer on a base material excluding a circuit pattern on a connecting surface of the other printed board.

8. The method for manufacturing a multilayer wiring board according to claim 7, wherein
    the insulating resin layer is formed of photosensitive resin.

9. The method for manufacturing a multilayer wiring board according to claim 1, wherein
    the sizes of the first printed board and the second printed board differ.

10. The method for manufacturing a multilayer wiring board according to claim 1, wherein
    at least a portion of the through holes formed by drilling necessary portions of at least one printed board and metal-plating the inner walls thereof has at least two hole diameters included in a single through hole.

11. The method for manufacturing a multilayer wiring board according to claim 10, wherein
    at least a portion of the through holes from which circuit patterns on which solder bumps are formed are drawn out has at least two hole diameters included in a single through hole.

12. A method for manufacturing a multilayer wiring board, wherein a first printed board having a pad portion is opposed to a second printed board having a pad portion, a wiring including a wiring portion and a bump mounting pad, and a board portion, the pad portion of the first printed board and the bump mounting pad of the second printed board are connected via a solder bump, the other connecting portions are adhered via an insulating adhesive, and at least a portion of the through holes formed to at least either the first printed board or the second printed board has a hollow structure, the method comprising:
    a step of forming a solder bump using a solder paste to at least either the bump mounting pad of the first printed board or the pad portion of the second printed board; and
    a step of laminating and adhering the first printed board and the second printed board by placing an insulating adhesive between the first printed board and the second printed board to thereby electrically connect the first printed board and the second printed board; wherein
    the size of the height of the solder bump is greater than the thickness of the insulating adhesive and smaller than four times the thickness of the insulating adhesive;
    during lamination and adhesion, the temperature of lamination and adhesion is within the range between a melting point of solder paste and the melting point of solder paste plus 40° C., and the pressure during lamination and adhesion is 1.5 MPa or smaller; and
    the method further comprising a step of providing an insulating resin layer on a base material and a circuit pattern excluding the circuit pattern on which solder bumps are formed on a connecting surface on which solder bumps are formed on at least one printed board, and a step of providing an insulating resin layer on a base material excluding a circuit pattern on a connecting surface of the other printed board.

13. The method for manufacturing a multilayer wiring board according to claim 12, wherein
    the insulating adhesive utilizes an insulating adhesive film having through holes formed in advance at positions corresponding to the solder bumps.

14. The method for manufacturing a multilayer wiring board according to claim 13, wherein
    during lamination and adhesion, the fluidity of the insulating adhesive is within the range of 1 to 300 μm.

15. The method for manufacturing a multilayer wiring board according to claim 12, further comprising
    a step of forming a through hole at a given position where the first printed board, the second printed board and the insulating adhesive overlap when aligned, and a step of inserting a pin at least 0.1 mm shorter than a total thickness of the first printed board, the second printed board and the insulating adhesive to the through hole.

16. The method for manufacturing a multilayer wiring board according to claim 12, wherein the insulating resin layer is formed of photosensitive resin.

17. The method for manufacturing a multilayer wiring board according to claim 12, wherein the sizes of the first printed board and the second printed board differ.

18. The method for manufacturing a multilayer wiring board according to claim 12, wherein at least a portion of the through holes formed by drilling necessary portions of at least one printed board and metal-plating the inner walls thereof has at least two hole diameters included in a single through hole.

19. The method for manufacturing a multilayer wiring board according to claim 18, wherein at least a portion of the through holes from which circuit patterns on which solder bumps are formed are drawn out has at least two hole diameters included in a single through hole.

* * * * *